United States Patent
Zhang et al.

(10) Patent No.: US 12,222,612 B2
(45) Date of Patent: Feb. 11, 2025

(54) ARRAY SUBSTRATE, DISPLAY PANEL, AND DISPLAY APPARATUS

(71) Applicants: Hefei BOE Display Technology Co., Ltd., Anhui (CN); BOE Technology Group Co., Ltd., Beijing (CN)

(72) Inventors: Chunxu Zhang, Beijing (CN); Yuntian Zhang, Beijing (CN); Xiaoting Jiang, Beijing (CN); Haipeng Yang, Beijing (CN); Ke Dai, Beijing (CN)

(73) Assignees: Hefei BOE Display Technology Co., Ltd., Anhui (CN); BOE Technology Grooup Co., Ltd., Beijing (CN)

( * ) Notice: Subject to any disclaimer, the term of this patent is extended or adjusted under 35 U.S.C. 154(b) by 329 days.

(21) Appl. No.: 17/789,141

(22) PCT Filed: May 13, 2021

(86) PCT No.: PCT/CN2021/093633
§ 371 (c)(1),
(2) Date: Jun. 24, 2022

(87) PCT Pub. No.: WO2022/001411
PCT Pub. Date: Jan. 6, 2022

(65) Prior Publication Data
US 2023/0092089 A1 Mar. 23, 2023

(30) Foreign Application Priority Data
Jun. 28, 2020 (CN) .......................... 202010598503.9

(51) Int. Cl.
*G02F 1/1345* (2006.01)
*G02F 1/1333* (2006.01)
(Continued)

(52) U.S. Cl.
CPC .... *G02F 1/13454* (2013.01); *G02F 1/133388* (2021.01); *G02F 1/136286* (2013.01);
(Continued)

(58) Field of Classification Search
None
See application file for complete search history.

(56) References Cited

U.S. PATENT DOCUMENTS 11,322,110 B2 * 5/2022 Huang ................. G09G 3/3688
11,361,724 B2 * 6/2022 He ....................... G09G 3/3677
(Continued)

FOREIGN PATENT DOCUMENTS

CN 1549997 A 11/2004
CN 101109881 A 1/2008
(Continued)

OTHER PUBLICATIONS

CN202010598503.9 first office action.
CN202010598503.9 second office action.

*Primary Examiner* — Richard H Kim
(74) *Attorney, Agent, or Firm* — IPro, PLLC

(57) ABSTRACT

Provided is an array substrate. The array substrate includes: a base substrate; a plurality of clock lines; a plurality of clock leads; a plurality of shift register units; and a compensation capacitor plate, disposed on the base substrate and in the peripheral region, wherein the compensation capacitor plate is connected to the clock lead, and the compensation capacitor plate and the clock lead are in different layers, an area of the compensation capacitor plate being negatively correlated with a length of the clock lead connected to the compensation capacitor plate.

19 Claims, 8 Drawing Sheets

(51) Int. Cl.
  *G02F 1/1335* (2006.01)
  *G02F 1/1362* (2006.01)
  *G09G 3/36* (2006.01)
  *H01L 27/12* (2006.01)
(52) U.S. Cl.
  CPC .... *H01L 27/1255* (2013.01); *G02F 1/133512* (2013.01); *G09G 3/3674* (2013.01); *G09G 2300/0426* (2013.01); *G09G 2310/0286* (2013.01)

(56) References Cited

U.S. PATENT DOCUMENTS

| | | |
|---|---|---|
| 2003/0189542 A1 | 10/2003 | Lee et al. |
| 2006/0197726 A1 | 9/2006 | Wu |
| 2009/0009674 A1 | 1/2009 | Chung et al. |
| 2015/0379951 A1 | 12/2015 | Zeng |
| 2017/0200420 A1 | 7/2017 | No et al. |
| 2017/0309242 A1 | 10/2017 | Kim et al. |
| 2018/0047329 A1 | 2/2018 | Shang et al. |
| 2019/0172408 A1 | 6/2019 | Miyake |
| 2021/0295795 A1* | 9/2021 | Xiong ................ G09G 3/3677 |
| 2021/0327383 A1 | 10/2021 | He |
| 2022/0122503 A1 | 4/2022 | Xiao |
| 2022/0328527 A1* | 10/2022 | Zhao ................ G09G 3/3677 |

FOREIGN PATENT DOCUMENTS

| | | |
|---|---|---|
| CN | 201984789 U | 9/2011 |
| CN | 105609074 A | 5/2016 |
| CN | 105739202 A | 7/2016 |
| CN | 106991949 A | 7/2017 |
| CN | 107305306 A | 10/2017 |
| CN | 109523963 A | 3/2019 |
| CN | 111091792 A | 5/2020 |
| CN | 111384066 A | 7/2020 |
| CN | 111445831 A | 7/2020 |
| CN | 111624827 A | 9/2020 |
| KR | 20070076791 A | 7/2007 |

* cited by examiner

ARRAY SUBSTRATE, DISPLAY PANEL, AND DISPLAY APPARATUS

CROSS-REFERENCE TO RELATED APPLICATION

This application is a U.S. national stage of international application No. PCT/CN2021/093633, filed on May 13, 2021, which claims priority to Chinese Patent Application No. 202010598503.9, filed on Jun. 28, 2020 and entitled "ARRAY SUBSTRATE, DISPLAY PANEL, AND DISPLAY APPARATUS," the disclosure of which is incorporated herein by reference in its entirety.

TECHNICAL FIELD

The present disclosure relates to the field of displays, and in particular, relates to an array substrate, a display panel, and a display apparatus.

BACKGROUND

A shift register (also referred to as a gate on array, GOA) is a gate drive circuit formed on an array substrate. The GOA has the advantage of retiring an independent gate drive chip, thereby reducing costs.

SUMMARY

Embodiments of the present disclosure provide an array substrate, a display panel, and a display apparatus.

According to one aspect of the embodiments of the present disclosure, an array substrate is provided. The array substrate includes:
  a base substrate, including a display region and a peripheral region surrounding the display region;
  a plurality of clock lines, disposed on the base substrate and in the peripheral region, wherein the clock lines extend in a first direction;
  a plurality of clock leads, disposed on the base substrate and in the peripheral region, wherein the clock leads extend in a second direction, the first direction being intersected with the second direction;
  a plurality of shift register units, disposed on the base substrate and in the peripheral region, wherein the shift register units are connected to the clock lines by the clock leads; and
  a compensation capacitor plate, disposed on the base substrate and in the peripheral region, wherein the compensation capacitor plate is connected to the clock lead, and the compensation capacitor plate and the clock lead are in different layers, an area of the compensation capacitor plate being negatively correlated with a length of the clock lead connected to the compensation capacitor plate.

Optionally, the clock lead includes a first clock lead, and the compensation capacitor plate connected to the first clock lead is strip-shaped.

Optionally, the strip-shaped compensation capacitor plate extends in the first direction.

Optionally, a distance between two compensation capacitor plates connected to two adjacent first clock leads is greater than a width of the strip-shaped compensation capacitor plate.

Optionally, the clock lead further includes a second clock lead, wherein the compensation capacitor plate connected to the second clock lead includes a first segment and a second segment that are connected sequentially in the first direction, a width of the first segment and a width of the second segment being different in the second direction, and a length of the second clock lead being less than a length of the first clock lead.

Optionally, an orthographic projection, on the base substrate, of the compensation capacitor plate is within an orthographic projection, on the base substrate, of the clock line connected to the compensation capacitor plate.

Optionally, a minimum distance between an orthographic projection, on the base substrate, of the compensation capacitor plate and an orthographic projection, on the base substrate, of another clock lead is greater than a first threshold, wherein the another clock lead is not connected to the compensation capacitor plate.

Optionally, the plurality of clock leads are arranged in the first direction and organized into a plurality of cycles, and the clock leads in each of the cycles are arranged sequentially in an ascending order in terms of length.

Optionally, the compensation capacitor plate connected to two shortest clock leads in the each of the cycles includes a first segment and a second segment that are connected sequentially in the first direction, a width of the first segment and a width of the second segment being different in the second direction.

Optionally, each of the clock leads is connected to the compensation capacitor plate by a plurality of first via holes.

Optionally, the array substrate further includes:
  a pixel electrode, disposed on the base substrate and in the display region; and
  the compensation capacitor plate and the pixel electrode are in a same layer.

Optionally, the array substrate further includes:
  a signal line of another type, disposed on the base substrate and in the peripheral region, wherein the signal line extends in the first direction, and the clock line is disposed between the signal line and the shift register unit.

Optionally, the array substrate further includes:
  an interdigital connection block, wherein one end of the clock lead is connected to the compensation capacitor plate by the connection block; and
  in the first direction, a width of the connection block is greater than a width of the clock lead.

According to another aspect of the embodiments of the present disclosure, a display panel is provided. The display panel includes:
  the array substrate described above; and
  a color film substrate, cell-assembled with the array substrate.

Optionally, the color film substrate includes a metal light-shielding layer; wherein
  the metal light-shielding layer and each of the compensation capacitor plate, the clock lead, and the clock line form a capacitor; and
  a sum of capacitance between the compensation capacitor plate and the metal light-shielding layer and capacitance between the metal light-shielding layer and the clock lead connected to the compensation capacitor plate is within a first capacitance range, a difference between an upper limit and a lower limit of the first capacitance range being less than a second threshold.

According to still another aspect of the embodiments of the present disclosure, a display apparatus is provided. The display apparatus includes the display panel described above.

BRIEF DESCRIPTION OF THE DRAWINGS

For clearer descriptions of the technical solutions in the embodiments of the present disclosure, the following briefly describes the accompanying drawings required for describing the embodiments. Apparently, the accompanying drawings in the following description illustrate merely some embodiments of the present disclosure, and those of ordinary skill in the art can still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

The GOA receives a plurality of control signals output by a drive integrated circuit, and then generates a gate drive signal to control a display panel. The GOA includes a plurality of cascaded GOA units. The plurality of GOA units are arranged in a column direction. The control signals include a plurality of clock (CLK) signals. The plurality of CLK signals are transmitted over a plurality of CLK lines. The plurality of CLK lines extend in the column direction, and are arranged in a peripheral region of the display panel sequentially in a row direction, and then respectively connected to corresponding GOA units by transverse CLK leads.

Figure 1:
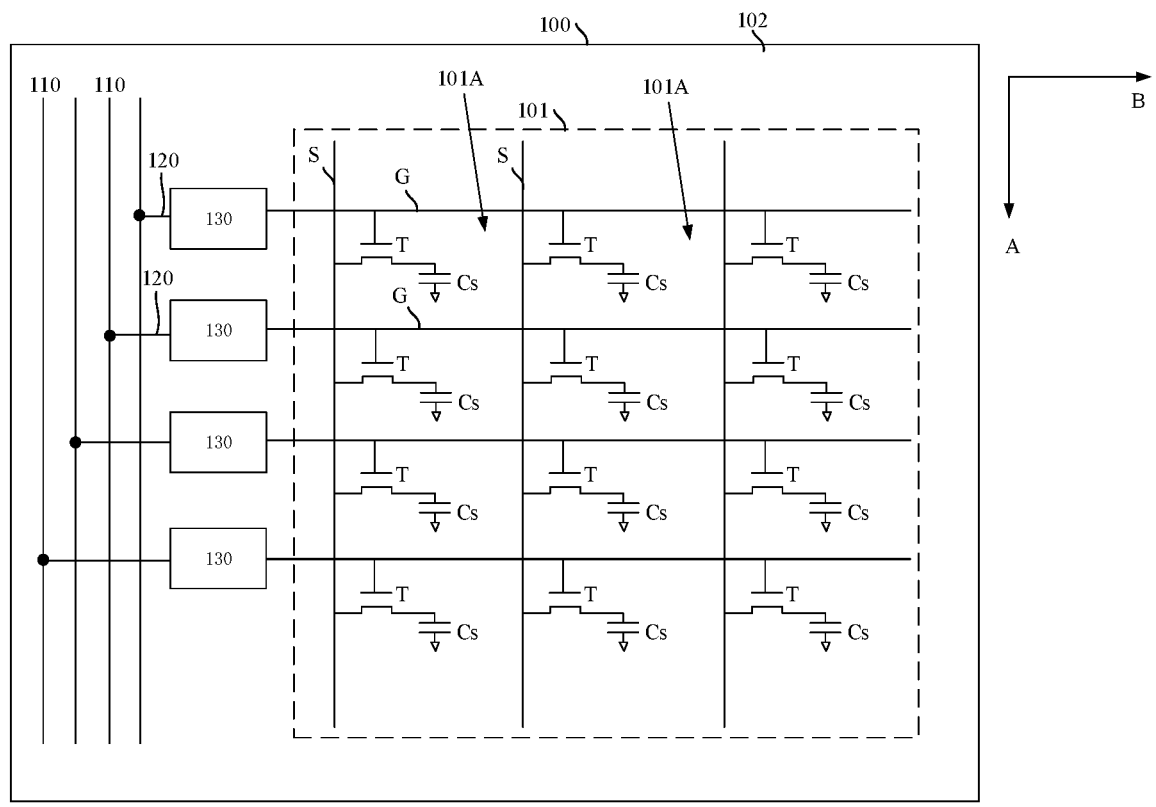
FIG. 1 is a schematic structural diagram of an array substrate in the related art.

The following first describes a structure of an array substrate with reference to FIG. 1. Referring to FIG. 1, the array substrate includes a base substrate 100, a gate line G, a data line S, and a transistor T.

The base substrate 100 includes a display region 101 and a peripheral region 102 surrounding the display region 101.

The gate line G and the data line S are disposed in the display region 101. The data line S extends in a first direction A. The gate line G extends in a second direction B. The first direction A intersects with the second direction B. The gate line G and the data line S define a plurality of pixel regions 101A in the display region 101. One transistor T (for example, a thin film transistor) is disposed in each of the pixel regions 101A. The gate line G is connected to a control electrode of the transistor T. The data line is connected to a first electrode of the transistor T. A second electrode of the transistor T is connected to a storage capacitor Cs. The control electrode is a gate of the transistor T. The first electrode and the second electrode are a source and a drain of the transistor respectively.

The array substrate further includes clock lines 110, clock leads 120, and shift register units 130.

The clock (CLK) line 110, the clock lead 120, and the shift register (GOA) unit 130 are all disposed in the peripheral region 102. The clock line 110 extends in the first direction A. The clock lead 120 extends in the second direction B.

The clock line 110 is connected to the shift register unit 130 by the clock lead 120. Input of each of the shift register units 130 corresponds to one clock lead 120 and one clock line 110. Output of each of the shift register units 130 corresponds to one gate line G.

Figure 2:
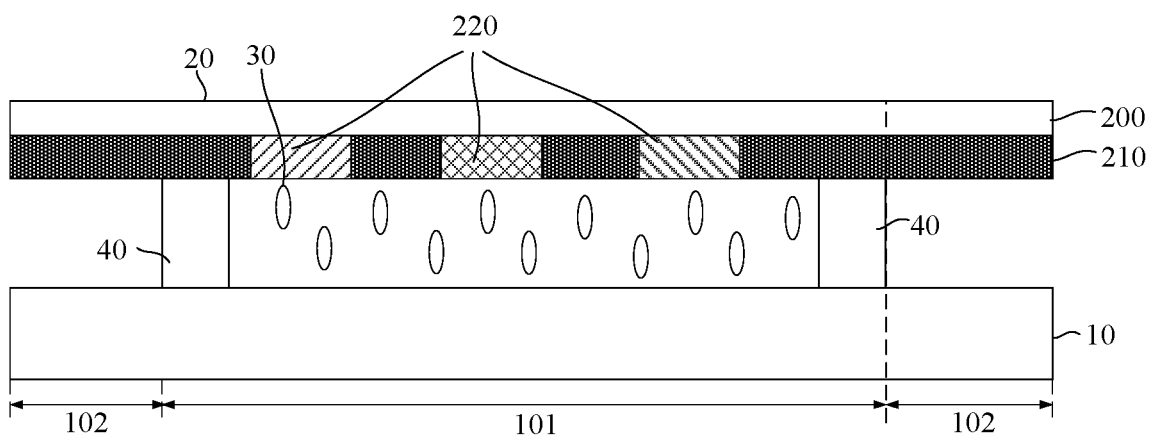
FIG. 2 is a schematic structural diagram of a display panel according to an embodiment of the present disclosure.

FIG. 2 is a schematic structural diagram of a display panel according to an embodiment of the present disclosure. Referring to FIG. 2, the display panel includes an array substrate 10 and a color film substrate 20. The array substrate 10 and the color film substrate 20 are cell-assembled each other, to form a liquid crystal box. The liquid crystal box is filled with liquid crystal 30.

The liquid crystal 30 is disposed in the display region 101. The display region 101 and the peripheral region 102 are isolated from each other by a sealant 40.

The color film substrate usually includes a base 200 as well as a metal light-shielding layer 210 and a color film layer 220 that are formed on the base 200.

The metal light-shielding layer 210, also referred to as a black matrix (BM), covers the peripheral region 102 of the base substrate 100. A portion, corresponding to the display region 101, of the metal light-shielding layer 210 has a plurality of light-transmitting regions. The light-transmitting regions are filled with the color film layer 220.

Capacitance exists between the clock line 110 and the metal light-shielding layer 210. Capacitance exists between the clock lead 120 and the metal light-shielding layer 210. Lengths of clock lines 110 connected to all the shift register units are the same. However, lengths of clock leads 120 connected to all the shift register units are different. As a result, areas of the clock leads 120 connected to all the shift register units are different. Further, areas of overlapped portions between the metal light-shielding layer 210 and the clock leads 120 connected to all the shift register units are different, which causes a difference between values of formed capacitance, and leads to relatively poor signal uniformity, thereby affecting display uniformity of the display panel.

Figure 3:
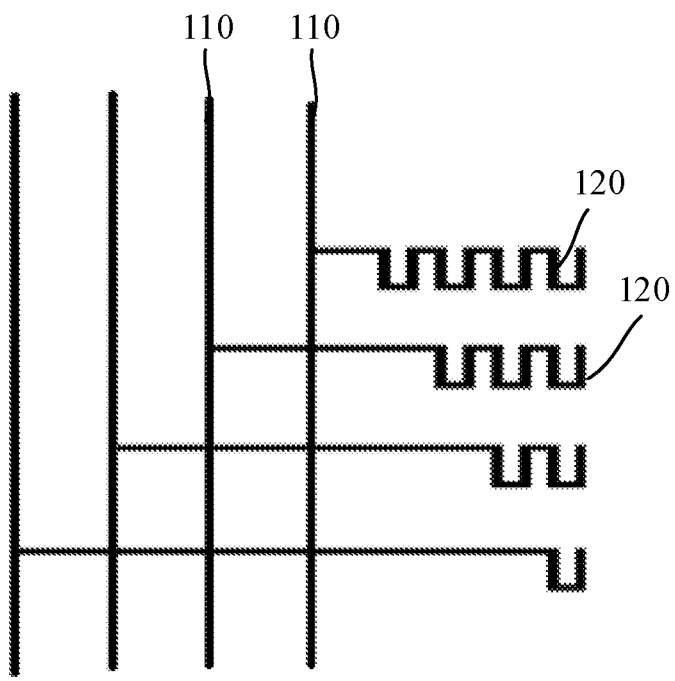
FIG. 3 is a schematic structural diagram of a clock lead in the related art.

To resolve the uniformity problem caused by a capacitance difference, the following solution illustrated in FIG. 3 is used in the related art: The values of capacitance between the metal light-shielding layer 210 and the clock leads 120 of all the shift register units are balanced by bending the clock leads 120.

However, for a large-size 8k display panel, because there are a large quantity of pixel rows, the size and the width of each pixel row are small. As a result, space for bending compensation of the clock leads is insufficient. However, in the case that capacitance is not compensated, loads on different clock lines and clock leads are different. In addition, a large-size 8k product has such a characteristic that resistance of a clock line and a clock lead of the product is high. Therefore, defective cross grains are easily formed on a display panel due to a great capacitance difference, which leads to poor display quality.

Figure 4:
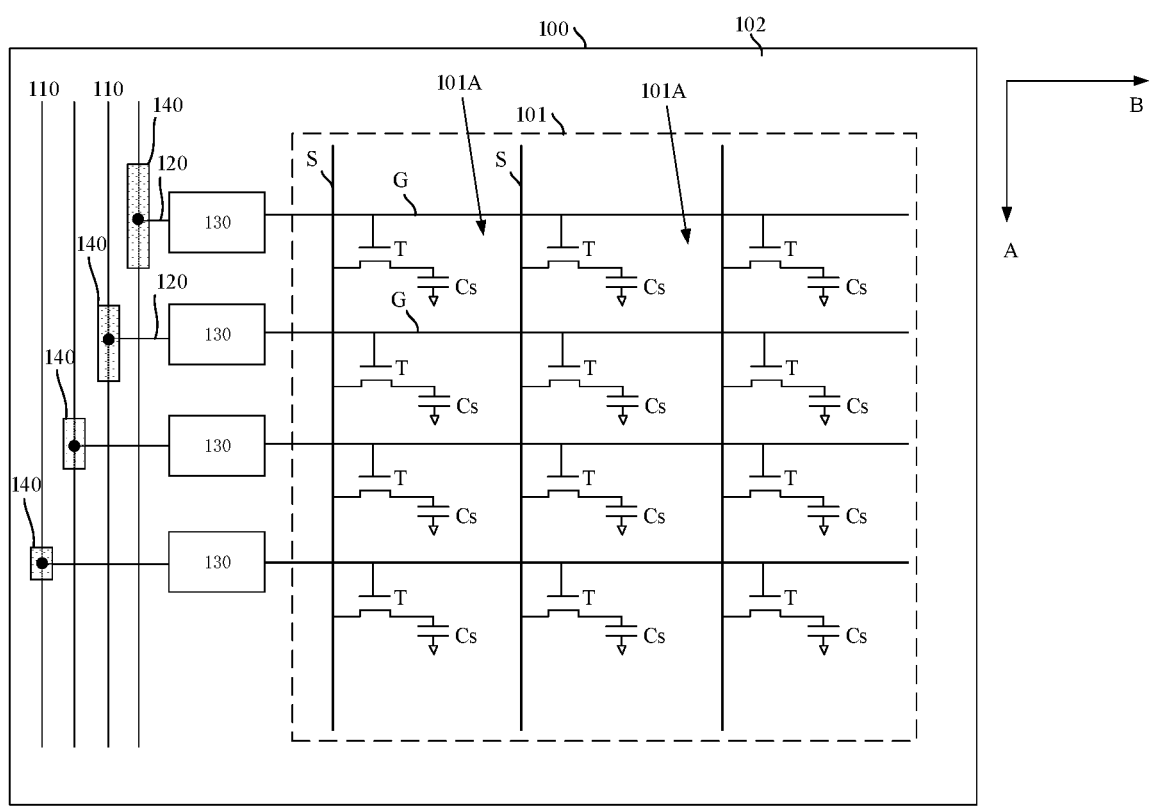
FIG. 4 is a schematic structural diagram of an array substrate according to an embodiment of the present disclosure.

FIG. 4 is a schematic structural diagram of an array substrate according to an embodiment of the present disclosure. Referring to FIG. 4, the array substrate includes: a base substrate 100, a plurality of clock lines 110, a plurality of clock leads 120, a plurality of shift register units 130, and compensation capacitor plates 140.

The base substrate 100 includes a display region 101 and a peripheral region 102 surrounding the display region. The clock lines 110 are disposed on the base substrate 100 and in the peripheral region 102, and extend in a first direction. The clock leads 120 are disposed on the base substrate 100 and in the peripheral region 102, and extend in a second direction. The first direction intersects with the second direction. The shift register units 130 are disposed on the base substrate 100 and in the peripheral region 102, and are connected to the clock lines 110 by the clock leads 120. The compensation capacitor plates 140 are disposed on the base substrate 100 and in the peripheral region 102, and are connected to the clock leads 120. The compensation capacitor plates 140 and the clock leads 120 are in different layers. An area of the compensation capacitor plate 140 is negatively correlated with a length of a clock lead 120 connected to the compensation capacitor plate.

Herein, "negatively correlated" means that a greater length of the clock lead 120 connected to the compensation capacitor plate 140 corresponds to a smaller area of the compensation capacitor plate 140, or that a less length of the clock lead 120 connected to the compensation capacitor plate 140 corresponds to a larger area of the compensation capacitor plate 140.

In the embodiments of the present disclosure, a compensation capacitor plate is disposed to compensate capacitance between a clock lead corresponding to each shift register unit and a metal light-shielding layer, and an area of the compensation capacitor plate is negatively correlated with a length of a clock lead connected to the compensation capacitor plate, such that greater compensation capacitance is required for such a shift register unit that original capacitance between the clock lead corresponding to each shift register unit and the metal light-shielding layer is smaller, which ensures that a capacitance between the clock lead corresponding to each shift register unit and the metal light-shielding layer is equivalent to a capacitance between the compensation capacitor plate and the metal light-shielding layer. Therefore, loads of clock leads corresponding to all shift register units match each other, which ensures that clock signals transmitted to all the shift register units over clock lines and clock leads are uniform, further ensures display uniformity of a display panel, and improves display quality of the display panel.

In addition, the compensation capacitor plate 140 and the clock lead 120 are in different layers. Compared with a fashion of bending the clock lead 120, the compensation capacitor plate 140 does not occupy an area of a layer on which the clock lead 120 is disposed, thereby being better arranged. This can ensure that design of the compensation capacitor plate 140 can be applied to a large-size 8k product or another product.

As illustrated in FIG. 4, in the second direction B, the lengths of the clock leads 120 become greater. Accordingly, the areas of the compensation capacitor plates 140 become smaller.

Figure 5:
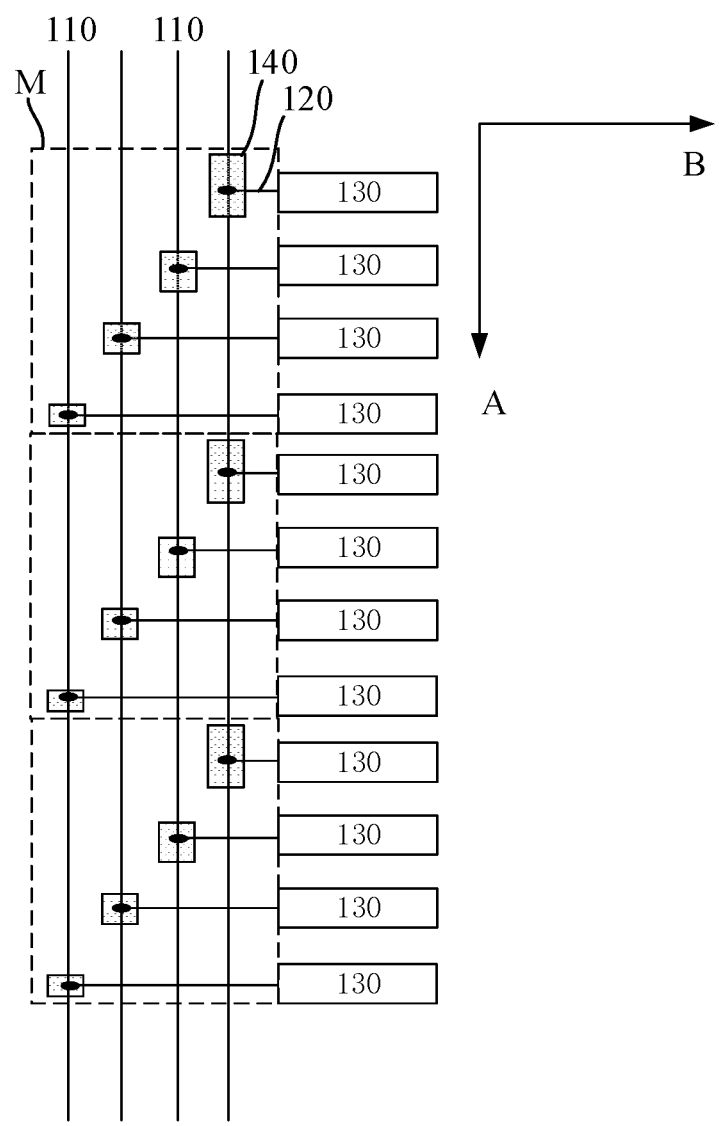
FIG. 5 is a schematic structural diagram of a peripheral region according to an embodiment of the present disclosure.

FIG. 5 is a schematic structural diagram of a peripheral region according to an embodiment of the present disclosure. Referring to FIG. 5, a plurality of clock leads 120 are arranged in the first direction A and divided into a plurality of cycles M. Each cycle M includes a plurality of clock leads 120. The clock leads 120 in each cycle M are arranged sequentially from short to long. In other words, FIG. 4 illustrates only clock leads 120 in one cycle, and FIG. 5 illustrates the clock leads 120 in three cycles. The clock lines 110 may supply clock signals to shift register units 130 corresponding to the clock leads 120 in each cycle in a time-sharing fashion.

In FIG. 5, the clock leads 120 in each cycle M are arranged sequentially from top to bottom and from short to long. In other embodiments, the clock leads 120 in each cycle M may also be arranged sequentially from bottom to top and from short to long.

As illustrated in FIG. 4 and FIG. 5, in the embodiments of the present disclosure, a shape of the compensation capacitor plate 140 may be rectangular. The rectangular compensation capacitor plate 140 facilitates design and manufacture of a display panel.

In other embodiments, the compensation capacitor plate 140 may also be of another regular shape, for example, circular or triangular. The compensation capacitor plate 140 may also be of an irregular shape.

Figure 6:
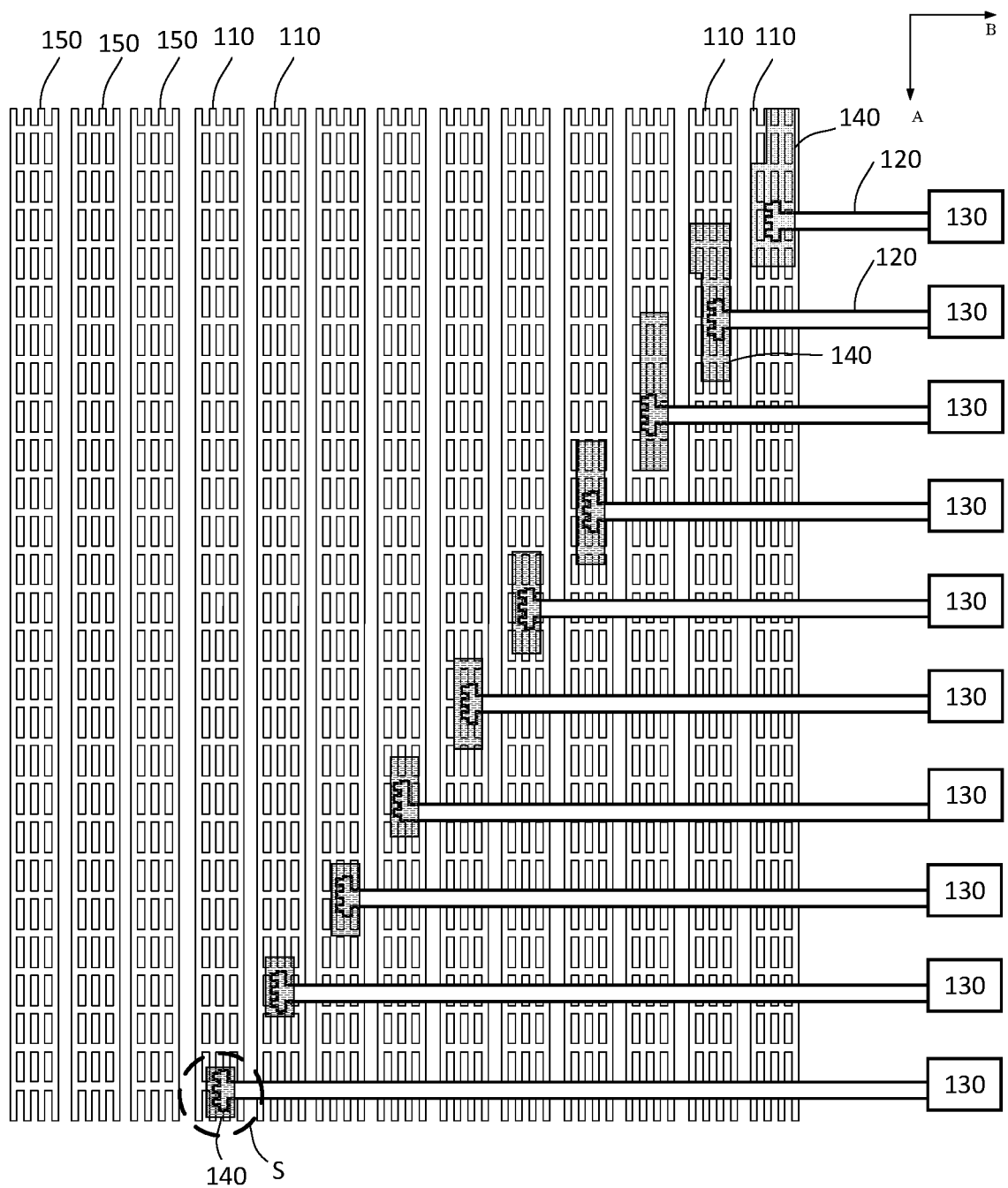
FIG. 6 is a schematic structural diagram of a peripheral region according to an embodiment of the present disclosure.

FIG. 6 is a schematic structural diagram of a peripheral region according to an embodiment of the present disclosure. Referring to FIG. 6, some of the compensation capacitor plates 140 are of rectangular shapes, and the other compensation capacitor plates 140 are of irregular shapes. The rectangular compensation capacitor plates 140 may be strips illustrated in FIG. 6.

Figure 7:
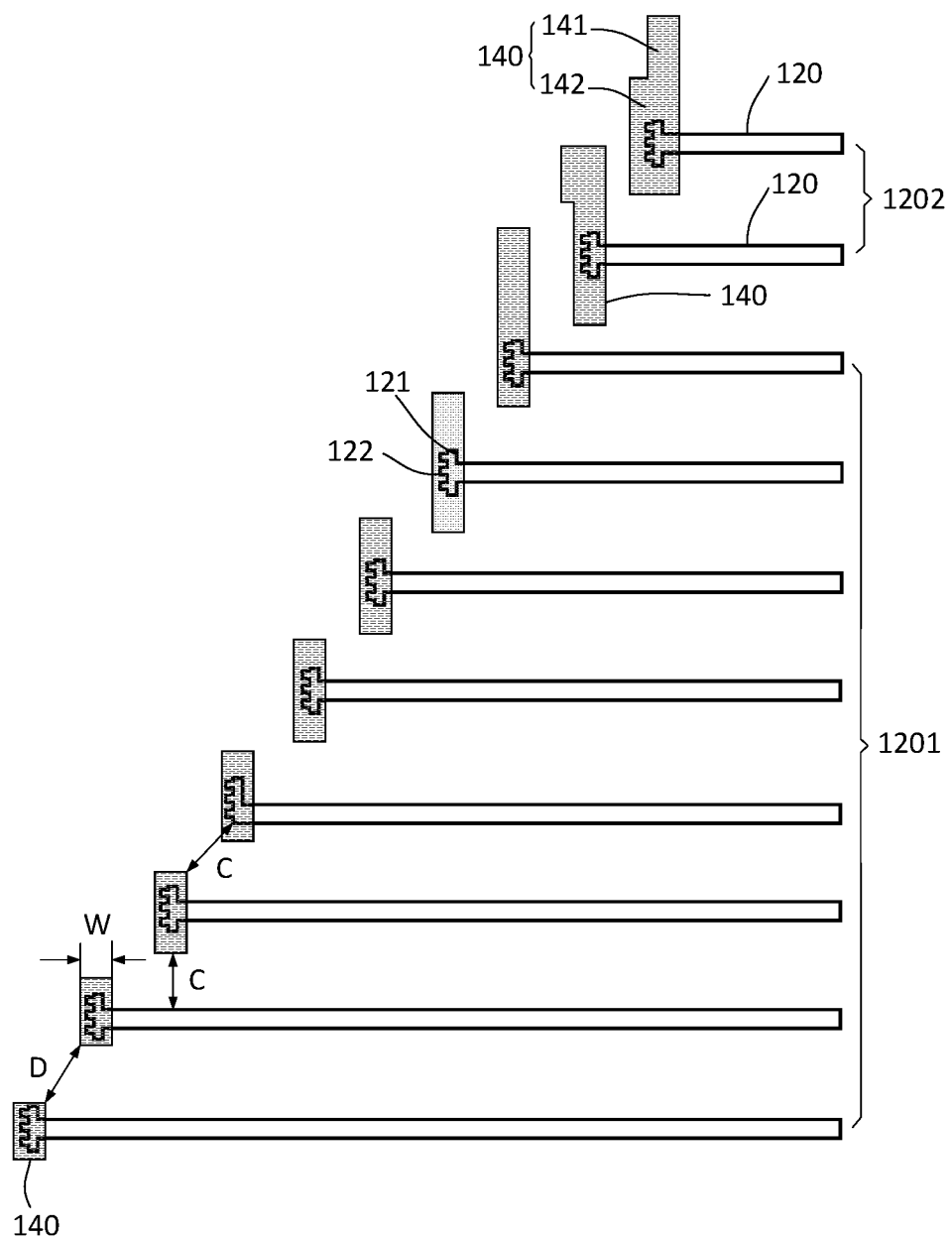
FIG. 7 is a diagram of a position relationship between a clock lead and a compensation capacitor plate.

FIG. 7 independently illustrates a diagram of a position relationship between a clock lead 120 and a compensation capacitor plate 140. Referring to FIG. 6 and FIG. 7, the clock leads 120 include first clock leads 1201, and the compensation capacitor plates 140 connected to the first clock leads 1201 are strip-shaped.

The clock leads 120 further include second clock leads 1202. Each compensation capacitor plate 140 connected to the second clock lead 1202 includes a first segment 141 and a second segment 142 that are arranged in the first direction. A width of the first segment 141 and a width of the second segment 142 are different in the second direction. A length of the second clock lead 1202 is less than a length of the first clock lead 1201.

In the embodiments of the present disclosure, the lengths of the first segment 141 and the second segment 142 may be different. For example, the length of the first segment 141 is greater than the length of the second segment 142, or the length of the second segment 142 is greater than the length of the first segment 141.

As illustrated in FIG. 6, the length of the first clock lead 1201 is greater, and the size of a corresponding compensation capacitor plate 140 is usually less. In this case, designing the compensation capacitor plate 140 to a strip facilitates not only manufacture, but also control of the distance between the compensation capacitor plate 140 and another clock line and another the clock lead. The length of the second clock lead 1202 is less, the size of a corresponding compensation capacitor plate 140 is usually greater. In this case, designing the compensation capacitor plate 140 to a strip may cause the length of the compensation capacitor plate 140 to be too great. As a result, the compensation capacitor plate 140 is overlapped with another clock lead 120. To ensure that formed capacitors are uniform, the compensation capacitor plate 140 is designed to several segments having different widths, such that the length of the compensation capacitor plate can be reduced, and the compensation capacitor plate can be prevented from being overlapped with the another clock lead, thereby reducing interference.

Usually, the strip-shaped compensation capacitor plate 140 extends in the first direction A, which ensures distances from the compensation capacitor plate 140 to another clock line and another clock lead, and further facilitates design and manufacture.

Referring to FIG. 7, a distance D between two compensation capacitor plates 140 connected to two adjacent first clock leads 1201 is greater than a width W of the strip-shaped compensation capacitor plate 140. This setting can ensure the distance between adjacent compensation capacitor plates, thereby avoiding interference between the compensation capacitor plates.

Herein, the distance D between the two compensation capacitor plates 140 may be a minimum distance between the two compensation capacitor plates 140.

Still referring to FIG. 6 and FIG. 7, both the first segment and the second segment of the compensation capacitor plate 140 are rectangular. In other embodiments, the first segment and the second segment may be of another regular or irregular shapes.

Still referring to FIG. 6 and FIG. 7, the compensation capacitor plate 140 connected to the second clock lead 1202 is L-shaped. In this case, the compensation capacitor plate 140 includes one first segment and one second segment. In other embodiments, the compensation capacitor plate 140 connected to the second clock lead 1202 may be of another shape, such as T-shaped or cruciform. For example, the compensation capacitor plate 140 is cruciform. In this case, the compensation capacitor plate 140 includes a first segment, a second segment, and a first segment that are disposed sequentially. There may be more or fewer first segments and second segments in other embodiments.

In the embodiments of the present disclosure, an orthographic projection, on the base substrate 100, of the compensation capacitor plate 140 is within an orthographic projection, on the base substrate 100, of the clock line 110 connected to the compensation capacitor plate 140. Due to the above design, the compensation capacitor plate 140 can be prevented from being overlapped with the clock line 110 that is not connected to the compensation capacitor plate 140, and can be kept a certain distance away from the clock line 110, thereby reducing interference between the compensation capacitor plate 140 and the clock line 110 that is not connected to the compensation capacitor plate 140.

In the embodiments of the present disclosure, a minimum distance C between an orthographic projection, on the base substrate 100, of the compensation capacitor plate 140 and an orthographic projection, on the base substrate 100, of another clock lead 120 is greater than a first threshold, wherein the another clock lead 120 is not connected to the compensation capacitor plate 140.

FIG. 7 illustrates minimum distances C between an orthographic projection of one compensation capacitor plate 140 and orthographic projections of two adjacent another clock leads 120 that are not connected to the compensation capacitor plate 140. Both the two minimum distances C need to be greater than the first threshold. A specific value of the first threshold may be specified based on parameters such as the size, voltage, or the like of the display panel, to avoid relatively great interference between the compensation capacitor plate and another clock lead 120.

In the display panels illustrated in FIG. 6 and FIG. 7, two shortest clock leads 120 in each cycle are second clock leads; and each compensation capacitor plate 140 connected to the two shortest clock leads 120 in each cycle includes a first segment 141 and a second segment 142 that are connected sequentially in the first direction.

In other embodiments, there may be one or more second clock leads in each cycle.

In the embodiments of the present disclosure, each clock lead 120 is connected to the compensation capacitor plate 140 by a plurality of first via holes. Stability of electric connection is ensured because the connection is performed based on the plurality of via holes.

For example, one end of the clock lead 120 is connected to the compensation capacitor plate 140 by the plurality of first via holes; and the other end of the clock lead 120 is connected to the shift register unit 130.

Figure 8:
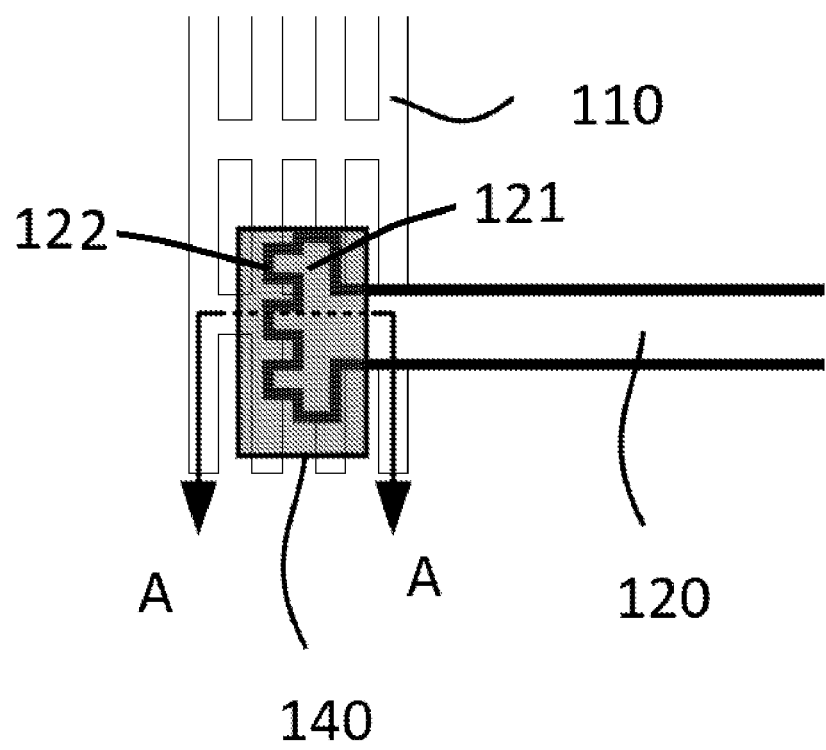
FIG. 8 is an enlarged schematic diagram of position S in the structure illustrated in FIG. 6.

FIG. 8 is an enlarged schematic diagram of position S in the structure illustrated in FIG. 6. Referring to FIG. 7 and FIG. 8, one end of each clock lead 120 may be provided with one connection block 121. The connection block 121 is connected to the compensation capacitor plate 140 by a plurality of first via holes (not illustrated in the figures), for example, three via holes illustrated in the figures. Similarly, the connection block 121 may also be connected to the clock line 110 by a plurality of via holes, for example, three via holes.

For example, a shape of the connection block 121 is interdigital, that is, the connection block 121 includes a connection block body and a plurality of bumps 122 connected to the connection block body. The plurality of bumps 122 are arranged in the first direction A. The connection block is connected to the first via hole by the plurality of bumps 122, thereby being connected to the compensation capacitor plate 140. Due to the above design, it is convenient to connect the clock lead 120 to the compensation capacitor plate 140. Stability of connection between the clock lead 120 and the compensation capacitor plate 140 is ensured because the connection is achieved based on the plurality of via holes.

In the first direction A, a width of the connection block 121 is greater than the width of the clock lead 120. In an aspect, it is ensured that the connection block 121 has a sufficient area and the clock lead 120 and the compensation capacitor plate 140 are connected by the plurality of via holes. In another aspect, because the connection block is designed for connection, the clock lead 120 does not need to be designed too wide, such that this connection solution can meet requirements of a large-size 8k display panel in a scenario with a large quantity of pixel rows and a small size.

Figure 9:
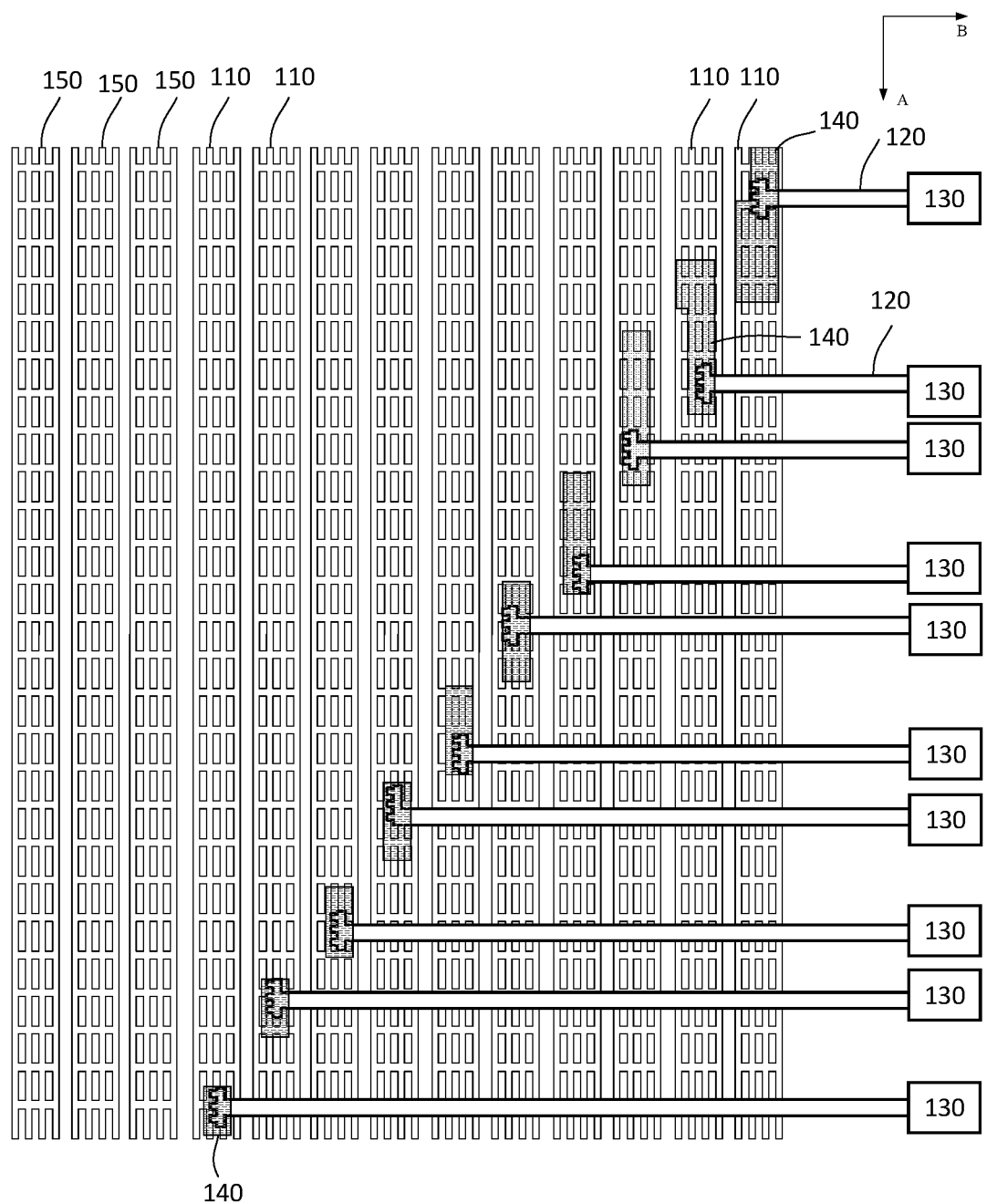
FIG. 9 is a schematic structural diagram of a peripheral region according to an embodiment of the present disclosure.

In the structure illustrated in FIG. 6, the plurality of clock leads 120 are evenly spaced; and all the clock leads 120 are connected to the middle of the compensation capacitor plate 140. FIG. 9 is a schematic structural diagram of a peripheral region according to an embodiment of the present disclosure. In the structure illustrated in FIG. 9, a plurality of clock leads 120 are not evenly spaced. In this case, some of the clock leads 120 are connected to middle portions of the compensation capacitor plates 140, and some of the clock leads 120 are connected to end portions of the compensation capacitor plates 140, thereby ensuring distances between the compensation capacitor plates 140 and the clock leads that are not connected to the compensation capacitor plates 140.

Still referring to FIG. 6 and FIG. 9, the array substrate further includes signal lines 150 of another type. The signal lines 150 are disposed on the base substrate 100 and in the peripheral region 102, and extend in the first direction. The clock lines 110 are disposed between the signal lines 150 and the shift register units 130.

For example, the signal line 150 may be a start signal line or a common electrode signal line.

As illustrated in FIG. 6 and FIG. 9, in the embodiments of the present disclosure, the clock line 110 may be a reticular line. An objective of designing the clock line 110 to the reticular line is to facilitate a patterning process. During the patterning process, light is radiated upwards from the bottom of the array substrate, and the reticular clock line 110 facilitates light transmission.

Figure 10:
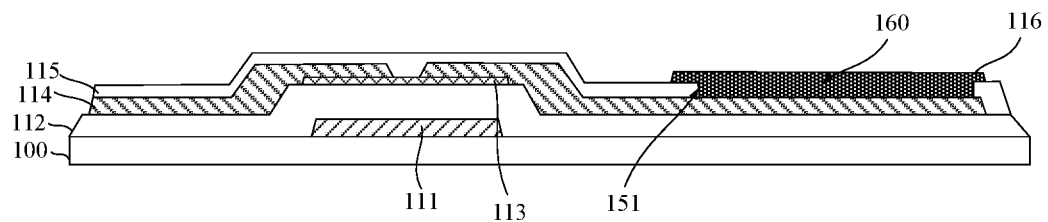
FIG. 10 is a schematic diagram of a film layer in a display region of an array substrate according to an embodiment of the present disclosure.
Figure 11:
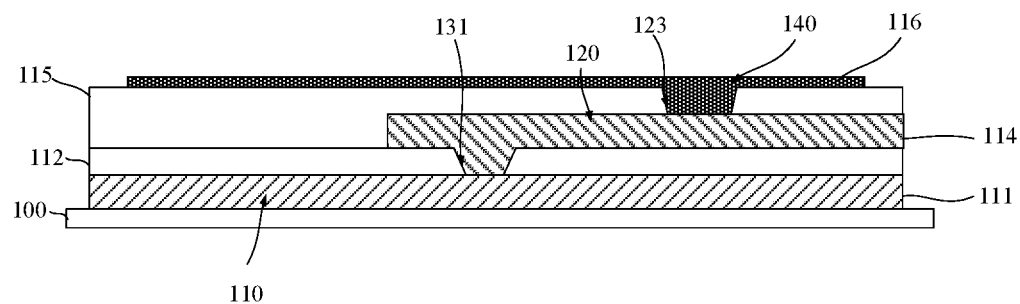
FIG. 11 is a schematic diagram of a film layer in a peripheral region of an array substrate according to an embodiment of the present disclosure.
Figure 12:
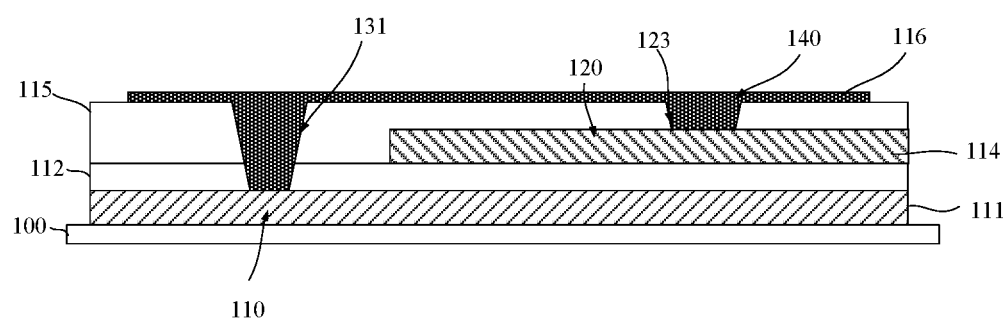
FIG. 12 is a schematic diagram of a film layer in a peripheral region of another array substrate according to an embodiment of the present disclosure.

The following describes film layer structures in a display region and a peripheral region of an array substrate with reference to FIG. 10 to FIG. 12.

FIG. 10 is a schematic diagram of a film layer in a display region of an array substrate according to an embodiment of the present disclosure. Referring to FIG. 10, in the display region, the array substrate includes a base substrate 100, a gate layer 111, a gate insulator (GI) layer 112, an active layer 113, a source/drain (SD) layer 114, an insulated protection layer 115, and a pixel electrode layer 116 that are laminated sequentially.

Both a source electrode and a drain electrode of a thin film transistor are disposed on the source/drain layer 114. A gate electrode is disposed on the gate layer 111. The gate electrode, the source electrode, the drain electrode, and the active layer define the thin film transistor. The structure illustrated in FIG. 10 is merely an example. In other embodiments, the array substrate may use another film layer structure, provided that the function of the array substrate can be implemented. For example, the structure illustrated in FIG. 10 corresponds to a bottom-gate thin film transistor. In other embodiments, the corresponding thin film transistor may be a top-gate thin film transistor or a double-gate thin film transistor.

In the embodiments of the present disclosure, the gate insulator layer 112 is disposed between the active layer 113 and the gate layer 111. The active layer 113 and the gate layer 111 are separated from each other by the gate insulator layer 112, such that the active layer 113 and the gate layer 111 are separated from each other and are capable of transmitting signals independently.

For example, the substrate 100 may be a glass substrate, such as a glass substrate or a plastic substrate. The gate layer 111 and the source/drain layer 114 may be metal layers or indium tin oxide layers, such that stability of electrical signal transmission of the gate layer 111 and the source/drain layer 114 is ensured. A material of the gate layer 111 may be the same as or different from a material of the source/drain layer 114. The gate insulator layer 112 and the insulated protection layer 115 may be inorganic insulating layers, for example, silicon nitride layers or silicon oxynitride layers; or may be organic insulating layers, for example, epoxy resin insulating layers. Because silicon nitride, silicon oxynitride, and epoxy resin have high insulating properties, insulating properties of the gate insulator layer 112 and the insulated protection layer 115 are ensured. The active layer 113 may be a poly-crystalline silicon layer or a mono-crystalline silicon layer. The pixel electrode layer 116 may be a transparent conductive thin film layer, for example, an indium tin oxide layer.

As illustrated in FIG. 10, a second via hole 151 is formed in the insulated protection layer 115, a pixel electrode 160 in the pixel electrode layer 116 is connected to the source electrode of the thin film transistor by the second via hole 151.

In some embodiments, the array substrate may further include another transparent conductive thin film layer disposed below the gate layer 111. The transparent conductive thin film layer and the gate layer 111 are disposed in an insulated fashion. A function of the transparent conductive thin film layer is to form a common (COM) electrode.

FIG. 11 is a schematic diagram of a film layer in a peripheral region of an array substrate according to an embodiment of the present disclosure. The schematic diagram of the film layer in the peripheral region corresponds to a section at position A-A in FIG. 8. Referring to FIG. 11, in the peripheral region, the array substrate includes a base substrate 100, a gate layer 111, a gate insulator layer 112, a source/drain layer 114, an insulated protection layer 115, and a pixel electrode layer 116 that are laminated sequentially.

A clock line 110 is disposed on the gate layer 111. A clock lead 120 is disposed on the source/drain layer 112. A compensation capacitor plate 140 is disposed on the pixel electrode layer 116.

As illustrated in FIG. 11, the clock lead 120 is connected to the clock line 110 by a third via hole 131; and the compensation capacitor plate 140 is connected to the clock lead 120 by a first via hole 123.

FIG. 12 is a schematic diagram of a film layer in a peripheral region of another array substrate according to an embodiment of the present disclosure. The schematic diagram of the film layer in the peripheral region corresponds to a section at position A-A in FIG. 8. The structure illustrated in FIG. 12 differs from the structure illustrated in FIG. 11 in that: a third via hole 131 is not configured to connect a clock lead 120 to a clock line 110, but is configured to connect a compensation capacitor plate 140 to the clock line 110. In this embodiment, the first via hole 123 and the third via hole 131 can be formed in a one-time patterning process. Compared with the structure in FIG. 11, the structure in FIG. 12 has a simpler manufacture process.

The embodiments of the present disclosure further provide a display panel. The display panel is a liquid crystal display panel. As illustrated in FIG. 2, the display panel includes the array substrate 10 and the color film substrate 20. The array substrate 10 and the color film substrate 20 are disposed in apposition to each other.

The array substrate 10 is the array substrate illustrated in any one of FIG. 4 to FIG. 12.

In the embodiments of the present disclosure, the color film substrate 20 includes a metal light-shielding layer 210. The metal light-shielding layer 210 and each of the compensation capacitor plate 140, the clock lead 120, and the clock line 110 form a capacitor. A sum of capacitance between the compensation capacitor plate 140 and the metal light-shielding layer 210 and capacitance between the metal light-shielding layer 210 and the clock lead 120 connected to the compensation capacitor plate 140 is within a first capacitance range, and a difference between an upper limit and a lower limit of the first capacitance range is less than a second threshold. A specific value of the second threshold may be determined based on a requirement of display uniformity. The second threshold needs to ensure uniformity of the display panel.

During designing of a display panel, a sum of capacitance between each compensation capacitor plate 140 and the metal light-shielding layer 210 and capacitance between the metal light-shielding layer 210 and the clock lead 120 connected to the compensation capacitor plate 140 is a setting value. However, due to impacts such as manufacture precision, in an actually manufactured display panel, it is impossible to ensure that all sums of capacitance between the compensation capacitor plates 140 and the metal light-shielding layer 210 and capacitance between the metal light-shielding layer 210 and the clock leads 120 connected to the compensation capacitor plates 140 are equal to the setting value. Therefore, it needs to ensure that these sums are within a capacitance range, to meet a requirement of uniformity of the display panel.

Because in the embodiments of the present disclosure, the compensation capacitor plate 140, the clock lead 120, and the clock line 110 are disposed in different layers, design of the compensation capacitor plate 140 cannot be implemented by simply calculating a sum of areas of the compensation capacitor plate 140, the clock lead 120, and the clock line 110. Instead, an area of the compensation capacitor plate 140 is calculated upon calculation of a capacitance that the compensation capacitor plate 140 needs to compensate for. The reason is as follows: in a known capacitance formula C=εS/d, ε denotes a dielectric constant of an inter-plate medium, S denotes an inter-plate overlapping area, and d denotes an inter-plate distance. The compensation capacitor plate 140, the clock lead 120, and the clock line 110 are in different layers, such that the inter-plate distance of a capacitor formed between the compensation capacitor plate 140 and the metal light-shielding layer 210 is different from the inter-plate distance of a capacitor formed between the clock lead 120 or the clock line 110 and the metal light-shielding layer 210. Therefore, a capacitance between the compensation capacitor plate 140 and the metal light-shielding layer 210 is different from a capacitance between the metal light-shielding layer 210 and the clock lead 120 or the clock line 110 that has an area equal to that of the compensation capacitor plate 140.

In the embodiments of the present disclosure, a compensation capacitor plate is disposed to compensate for a capacitance between a clock lead corresponding to each shift register unit and a metal light-shielding layer, and an area of the compensation capacitor plate is negatively correlated with a length of a clock lead connected to the compensation capacitor plate, such that greater compensation capacitance is required for such a shift register unit that original capacitance between the clock lead and the mental light-shielding layer is smaller, which ensures that a capacitance between the clock lead corresponding to each shift register unit and the metal light-shielding layer is equivalent to a capacitance between the compensation capacitor plate and the metal light-shielding layer. Therefore, loads of clock leads corresponding to all shift register units match each other, which ensures that clock signals transmitted to all the shift register units over clock lines and clock leads are uniform, further ensures display uniformity of a display panel, and improves display quality of the display panel.

The embodiments of the present disclosure further provide a display apparatus. The display apparatus includes any display panel described above.

In specific implementation, the display apparatus according to the embodiments of the present disclosure may be any product or component with a display function, such as a mobile phone, a tablet computer, a TV, a display, a notebook computer, a digital photo frame, or a navigator.

In the embodiments of the present disclosure, a compensation capacitor plate is disposed to compensate capacitance between a clock lead corresponding to each shift register unit and a metal light-shielding layer, and an area of the compensation capacitor plate is negatively correlated with a length of a clock lead connected to the compensation capacitor plate, such that greater compensation capacitance is required for such a shift register unit that original capacitance between the clock lead corresponding to each shift register unit and the metal light-shielding layer is smaller, which ensures that a capacitance between the clock lead corresponding to each shift register unit and the metal light-shielding layer is equivalent to capacitance between the compensation capacitor plate and the metal light-shielding layer. Therefore, loads of clock leads corresponding to all shift register units match each other, which ensures that clock signals transmitted to all the shift register units over clock lines and clock leads are uniform, further ensures display uniformity of a display panel, and improves display quality of the display panel.

Described above are merely optional embodiments of the present disclosure, but are not intended to limit the present disclosure. Any modification, equivalent replacement, or improvement made without departing from the spirit and principle of the present disclosure shall fall within the protection scope of the present disclosure.

What is claimed is:

1. An array substrate, comprising:
   a base substrate, comprising a display region and a peripheral region surrounding the display region;
   a plurality of clock lines, disposed on the base substrate and in the peripheral region, wherein the clock lines extend in a first direction;
   a plurality of clock leads, disposed on the base substrate and in the peripheral region, wherein the clock leads extend in a second direction, the first direction being intersected with the second direction;
   a plurality of shift register units, disposed on the base substrate and in the peripheral region, wherein the shift register units are connected to the clock lines by the clock leads; and
   a compensation capacitor plate, disposed on the base substrate and in the peripheral region, wherein the compensation capacitor plate is connected to the clock lead, and the compensation capacitor plate and the clock lead are in different layers, an area of the compensation capacitor plate being negatively correlated with a length of the clock lead connected to the compensation capacitor plate,
   wherein the clock lead further comprises a second clock lead, wherein the compensation capacitor plate connected to the second clock lead comprises a first segment and a second segment that are connected sequentially in the first direction, a width of the first segment and a width of the second segment being different in the second direction, and a length of the second clock lead being less than a length of the first clock lead.

2. The array substrate according to claim 1, wherein the clock lead comprises a first clock lead, and the compensation capacitor plate connected to the first clock lead is strip-shaped.

3. The array substrate according to claim 2, wherein the strip-shaped compensation capacitor plate extends in the first direction.

4. The array substrate according to claim 3, wherein a distance between two compensation capacitor plates connected to two adjacent first clock leads is greater than a width of the strip-shaped compensation capacitor plate.

5. The array substrate according to claim 1, wherein an orthographic projection, on the base substrate, of the compensation capacitor plate is within an orthographic projection, on the base substrate, of the clock line connected to the compensation capacitor plate.

6. The array substrate according to claim 1, wherein a minimum distance between an orthographic projection, on the base substrate, of the compensation capacitor plate and an orthographic projection, on the base substrate, of another clock lead is greater than a first threshold, wherein the another clock lead is not connected to the compensation capacitor plate.

7. The array substrate according to claim 1, wherein the plurality of clock leads are arranged in the first direction and organized into a plurality of cycles, and the clock leads in each of the cycles are arranged sequentially in an ascending order in terms of length.

8. The array substrate according to claim 7, wherein the compensation capacitor plate connected to two shortest clock leads in the each of the cycles comprises a first segment and a second segment that are connected sequentially in the first direction, a width of the first segment and a width of the second segment being different in the second direction.

9. The array substrate according to claim 1, wherein each clock lead is connected to the compensation capacitor plate by a plurality of first via holes.

10. The array substrate according to claim 1, further comprising:
a pixel electrode, disposed on the base substrate and in the display region; and
the compensation capacitor plate and the pixel electrode are in a same layer.

11. The array substrate according to claim 9, wherein each clock lead is connected to the corresponding clock line by a third via hole.

12. The array substrate according to claim 9, wherein each clock lead is connected to the compensation capacitor plate by a third via hole, and the first via hole and the third via hole is formed in a one-time patterning process.

13. The array substrate according to claim 1, further comprising:
a signal line of another type, disposed on the base substrate and in the peripheral region, wherein the signal line extends in the first direction, and the clock line is disposed between the signal line and the shift register unit.

14. The array substrate according to claim 1, further comprising:
an interdigital connection block, wherein one end of the clock lead is connected to the compensation capacitor plate by the connection block; and
in the first direction, a width of the connection block is greater than a width of the clock lead.

15. The array substrate according to claim 14, wherein the connection block comprises a connection block body and a plurality of bumps connected to the connection block body, and the connection block is connected to a first via hole by the plurality of bumps, thereby being connected to the compensation capacitor plate.

16. The array substrate according to claim 1, wherein part of the plurality of clock leads are connected to middle portions of the compensation capacitor plates, and another part of the plurality of the clock leads are connected to end portions of the compensation capacitor plates.

17. A display panel, comprising:
an array substrate; and
a color film substrate, cell-assembled with the array substrate,
wherein the array substrate comprises:

a base substrate, comprising a display region and a peripheral region surrounding the display region;
a plurality of clock lines, disposed on the base substrate and in the peripheral region, wherein the clock lines extend in a first direction;
a plurality of clock leads, disposed on the base substrate and in the peripheral region, wherein the clock leads extend in a second direction, the first direction being intersected with the second direction;
a plurality of shift register units, disposed on the base substrate and in the peripheral region, wherein the shift register units are connected to the clock lines by the clock leads; and
a compensation capacitor plate, disposed on the base substrate and in the peripheral region, wherein the compensation capacitor plate is connected to the clock lead, and the compensation capacitor plate and the clock lead are in different layers, an area of the compensation capacitor plate being negatively correlated with a length of the clock lead connected to the compensation capacitor plate,
wherein the clock lead further comprises a second clock lead, wherein the compensation capacitor plate connected to the second clock lead comprises a first segment and a second segment that are connected sequentially in the first direction, a width of the first segment and a width of the second segment being different in the second direction, and a length of the second clock lead being less than a length of the first clock lead.

18. The display panel according to claim 17, wherein the color film substrate comprises a metal light-shielding layer; wherein
the metal light-shielding layer and each of the compensation capacitor plate, the clock lead, and the clock line form a capacitor; and
a sum of a capacitance between the compensation capacitor plate and the metal light-shielding layer and a capacitance between the metal light-shielding layer and the clock lead connected to the compensation capacitor plate is within a first capacitance range, a difference between an upper limit and a lower limit of the first capacitance range being less than a second threshold.

19. A display apparatus, comprising a display panel which comprises:
an array substrate; and
a color film substrate, cell-assembled with the array substrate,
wherein the array substrate comprises:
a base substrate, comprising a display region and a peripheral region surrounding the display region;
a plurality of clock lines, disposed on the base substrate and in the peripheral region, wherein the clock lines extend in a first direction;
a plurality of clock leads, disposed on the base substrate and in the peripheral region, wherein the clock leads extend in a second direction, the first direction being intersected with the second direction;
a plurality of shift register units, disposed on the base substrate and in the peripheral region, wherein the shift register units are connected to the clock lines by the clock leads; and
a compensation capacitor plate, disposed on the base substrate and in the peripheral region, wherein the compensation capacitor plate is connected to the clock lead, and the compensation capacitor plate and the clock lead are in different layers, an area of the compensation capacitor plate being negatively correlated with a length of the clock lead connected to the compensation capacitor plate, wherein the clock lead further comprises a second clock lead, wherein the compensation capacitor plate connected to the second clock lead comprises a first segment and a second segment that are connected sequentially in the first direction, a width of the first segment and a width of the second segment being different in the second direction, and a length of the second clock lead being less than a length of the first clock lead.

\* \* \* \* \*

UNITED STATES PATENT AND TRADEMARK OFFICE
CERTIFICATE OF CORRECTION

| | | |
|---|---|---|
| PATENT NO. | : 12,222,612 B2 | Page 1 of 1 |
| APPLICATION NO. | : 17/789141 | |
| DATED | : February 11, 2025 | |
| INVENTOR(S) | : Chunxu Zhang | |

It is certified that error appears in the above-identified patent and that said Letters Patent is hereby corrected as shown below:

On the Title Page

Item (73) should read:
(73) Assignees: Hefei BOE Display Technology Co., Ltd., Hefei, Anhui (CN); BOE Technology Group Co., Ltd., Beijing (CN)

Signed and Sealed this
Twelfth Day of August, 2025

Coke Morgan Stewart
*Acting Director of the United States Patent and Trademark Office*